(12) United States Patent
Newdoll et al.

(10) Patent No.: US 10,250,184 B2
(45) Date of Patent: *Apr. 2, 2019

(54) ENHANCED SOLAR PANELS, LIQUID DELIVERY SYSTEMS AND ASSOCIATED PROCESSES FOR SOLAR ENERGY SYSTEMS

(71) Applicant: Accurate Solar Power, LLC, Menlo Park, CA (US)

(72) Inventors: Ronald M. Newdoll, Woodside, CA (US); Argil E. Shaver, II, Menlo Park, CA (US)

(73) Assignee: Accurate Solar Power, LLC, Menlo Park, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 15/275,251

(22) Filed: Sep. 23, 2016

(65) Prior Publication Data

US 2017/0012575 A1    Jan. 12, 2017

Related U.S. Application Data

(60) Continuation of application No. 14/938,801, filed on Nov. 11, 2015, now abandoned, which is a division of (Continued)

(51) Int. Cl.
*H02S 40/10*    (2014.01)
*H01L 31/02*    (2006.01)
(Continued)

(52) U.S. Cl.
CPC ............ *H02S 40/10* (2014.12); *B08B 3/024* (2013.01); *B08B 3/04* (2013.01); *F24S 40/20* (2018.05);
(Continued)

(58) Field of Classification Search
None
See application file for complete search history.

(56) References Cited

U.S. PATENT DOCUMENTS

| 3,958,171 A | 5/1976 | Sekino |
| 4,488,791 A | 12/1984 | Hinchliffe |

(Continued)

FOREIGN PATENT DOCUMENTS

| AU | 2010101396 | 2/2011 |
| CN | 201141544 | 10/2008 |

(Continued)

OTHER PUBLICATIONS

Derwent translation KR2009058624A, 2010 (Year: 2010).*

(Continued)

*Primary Examiner* — Jason Y Ko
*Assistant Examiner* — Cristi J Tate-Sims
(74) *Attorney, Agent, or Firm* — Michael A. Glenn; Perkins Coie LLP

(57) ABSTRACT

Fluid delivery systems and related structures and processes are provided, such as for use with water, treated water, and/or a cleaning solution, for any of cleaning, cooling or any combination thereof, for one or more solar panels in a power generation environment. Enhanced coatings are provided for the incident surface of solar panels, such as to avoid build up of dirt, scale, or other contaminants, and/or to improve cleaning performance. Reclamation, filtration, and reuse structures are preferably provided for the delivered fluid, and seal structures may preferably be implemented between adjoining panels, to minimize loss of the delivered water or cleaning solution.

20 Claims, 13 Drawing Sheets

Related U.S. Application Data application No. 13/389,951, filed as application No. PCT/US2010/045352 on Aug. 12, 2010, now Pat. No. 9,200,818, which is a continuation-in-part of application No. 12/842,864, filed on Jul. 23, 2010, now Pat. No. 8,035,249.

(60) Provisional application No. 61/234,181, filed on Aug. 14, 2009.

(51) Int. Cl.

| | | |
|---|---|---|
| *H02S 40/32* | (2014.01) | |
| *H02S 40/42* | (2014.01) | |
| *B08B 3/02* | (2006.01) | |
| *B08B 3/04* | (2006.01) | |
| *H01L 31/048* | (2014.01) | |
| *H01L 31/052* | (2014.01) | |
| *H02S 50/00* | (2014.01) | |
| *H02S 50/10* | (2014.01) | |
| *F24S 40/20* | (2018.01) | |

(52) U.S. Cl.
CPC .... *H01L 31/02021* (2013.01); *H01L 31/0481* (2013.01); *H01L 31/0521* (2013.01); *H02S 40/32* (2014.12); *H02S 40/425* (2014.12); *H02S 50/00* (2013.01); *H02S 50/10* (2014.12); *Y02E 10/40* (2013.01); *Y02E 10/50* (2013.01)

(56) References Cited

U.S. PATENT DOCUMENTS

| | | | |
|---|---|---|---|
| 4,599,685 A | 7/1986 | Hombu et al. | |
| 5,706,798 A | 1/1998 | Steinorth | |
| 5,742,495 A | 4/1998 | Barone | |
| 5,982,253 A | 11/1999 | Perrin et al. | |
| 6,153,823 A | 11/2000 | Shiozaki et al. | |
| 6,201,180 B1 | 3/2001 | Meyer et al. | |
| 6,285,572 B1 | 9/2001 | Onizuka et al. | |
| 6,291,762 B1 | 9/2001 | Jan et al. | |
| 6,750,391 B2 | 6/2004 | Bower et al. | |
| 6,810,339 B2 | 10/2004 | Wills | |
| 7,104,064 B2 | 9/2006 | Hon | |
| 7,443,052 B2 | 10/2008 | Wendt et al. | |
| 7,444,816 B2 | 11/2008 | Hon | |
| 7,731,383 B2 | 6/2010 | Myer | |
| 7,772,716 B2 | 8/2010 | Shaver | |
| 7,866,927 B1 | 1/2011 | Wong | |
| 7,994,657 B2 | 8/2011 | Kimball et al. | |
| 8,035,249 B2 | 10/2011 | Shaver et al. | |
| 9,196,770 B2 | 11/2015 | Newdoll et al. | |
| 2002/0066473 A1 | 6/2002 | Levy et al. | |
| 2002/0074034 A1 | 6/2002 | Fujisaki et al. | |
| 2003/0111103 A1 | 6/2003 | Bower et al. | |
| 2003/0177706 A1 | 9/2003 | Ullman | |
| 2004/0145188 A1 | 7/2004 | Janssen et al. | |
| 2004/0207366 A1 | 10/2004 | Sung | |
| 2004/0261334 A1 | 12/2004 | Liebendorfer et al. | |
| 2005/0076563 A1 | 4/2005 | Faris | |
| 2006/0103360 A9 | 5/2006 | Cutler et al. | |
| 2006/0185727 A1 | 8/2006 | Matan | |
| 2006/0266408 A1 | 11/2006 | Horne et al. | |
| 2007/0089778 A1 | 4/2007 | Horne et al. | |
| 2007/0090653 A1 | 4/2007 | Martelon | |
| 2007/0113881 A1* | 5/2007 | Mellott | C03C 3/087 136/243 |
| 2007/0221267 A1 | 9/2007 | Fornage | |
| 2007/0271006 A1 | 11/2007 | Golden et al. | |
| 2008/0149786 A1 | 6/2008 | Bradley | |
| 2008/0149791 A1 | 6/2008 | Bradley | |
| 2008/0150484 A1 | 6/2008 | Kimball et al. | |
| 2008/0169652 A1 | 7/2008 | Green | |
| 2008/0236646 A1* | 10/2008 | Kelly | C25B 1/04 136/244 |
| 2008/0238195 A1 | 10/2008 | Shaver, II et al. | |
| 2009/0030605 A1 | 1/2009 | Breed | |
| 2009/0040750 A1 | 2/2009 | Myer | |
| 2009/0078299 A1 | 3/2009 | Cinnamon et al. | |
| 2009/0090895 A1 | 4/2009 | Hogan, Jr. | |
| 2009/0146501 A1 | 6/2009 | Cyrus | |
| 2009/0150005 A1 | 6/2009 | Hader et al. | |
| 2009/0160259 A1* | 6/2009 | Naiknaware | H02M 7/4807 307/82 |
| 2009/0194669 A1 | 8/2009 | Noble et al. | |
| 2009/0199846 A1 | 8/2009 | Collins et al. | |
| 2009/0266353 A1 | 10/2009 | Lee | |
| 2009/0283129 A1 | 11/2009 | Foss | |
| 2009/0293932 A1* | 12/2009 | Augenbraun | H01L 31/02008 136/244 |
| 2010/0043851 A1* | 2/2010 | Levy | B08B 3/02 134/56 R |
| 2010/0205870 A1 | 8/2010 | Cobb | |
| 2010/0212093 A1* | 8/2010 | Pak | F24J 2/40 15/97.1 |
| 2010/0236164 A1* | 9/2010 | Chuang | A01G 9/243 52/173.3 |
| 2010/0237305 A1 | 9/2010 | Miller | |
| 2010/0270808 A1 | 10/2010 | Bates et al. | |
| 2010/0284737 A1 | 11/2010 | McPheeters | |
| 2010/0296285 A1 | 11/2010 | Chemel et al. | |
| 2010/0328931 A1 | 12/2010 | Fogerlie | |
| 2010/0328932 A1 | 12/2010 | Fogerlie | |
| 2011/0005583 A1 | 1/2011 | Thomas | |
| 2011/0017256 A1 | 1/2011 | Stevens | |
| 2011/0041834 A1 | 2/2011 | Liao | |
| 2011/0058664 A1 | 3/2011 | Prax et al. | |
| 2011/0073161 A1 | 3/2011 | Scanlon | |
| 2011/0085322 A1 | 4/2011 | Myer | |
| 2011/0120523 A1 | 5/2011 | Silver | |
| 2011/0163222 A1 | 7/2011 | Moser | |
| 2011/0192460 A1 | 8/2011 | Tan | |
| 2011/0265840 A1 | 11/2011 | Sela | |
| 2012/0187222 A1 | 7/2012 | Galili et al. | |

FOREIGN PATENT DOCUMENTS

| | | |
|---|---|---|
| CN | 202362621 | 8/2012 |
| DE | 103 20 347 | 12/2004 |
| EP | 033706 | 9/1989 |
| JP | S59 79579 | 5/1984 |
| JP | 59-150484 | 8/1984 |
| JP | S62 13084 | 1/1987 |
| JP | 9182459 | 7/1997 |
| JP | H10 308523 | 11/1998 |
| JP | 3405035 | 5/2003 |
| JP | 2003-197945 | 7/2003 |
| JP | 2003-199377 | 7/2003 |
| KR | 2009010561 | 1/2009 |
| WO | 2005/076444 | 8/2005 |
| WO | 200622590 | 3/2006 |
| WO | 2006/078685 | 7/2006 |
| WO | 2006071436 | 7/2006 |
| WO | 2006130520 | 12/2006 |
| WO | 2007/106519 | 9/2007 |
| WO | 200845335 | 4/2008 |
| WO | 200880088 | 7/2008 |
| WO | 200888311 | 7/2008 |
| WO | 2008/125915 | 10/2008 |
| WO | 2008/129089 A1 | 10/2008 |
| WO | 2008/144540 | 11/2008 |
| WO | 200938810 | 3/2009 |
| WO | 2009/044982 | 4/2009 |
| WO | 2009114730 | 9/2009 |
| WO | 201008927 | 1/2010 |
| WO | 201050993 | 5/2010 |
| WO | 201068706 | 6/2010 |
| WO | 2010102256 | 9/2010 |
| WO | 2010118236 | 10/2010 |
| WO | 2010118503 | 10/2010 |
| WO | 20100123538 | 10/2010 |
| WO | 2011044641 | 4/2011 |

(56) References Cited

FOREIGN PATENT DOCUMENTS

OTHER PUBLICATIONS

Long Island Power Authority Requirements for Interconnection of New Distributed Generation Units with Capacity of 300kVA, Radial Distribution Lines, (Date Unknown—before Jun. 19, 2006), 1-12.
Solar Tracking System, Solazone, solar tracker, retrieved online on Aug. 19, 2011 from url: http://www.solazone.com.au/tracker.htm, 7 pages.
Welcome to the next phase of solar, enphase ENERGY Brochure System Overview; retrieved Sep. 13, 2012 online from url: http://enphase.com/producs/microinverters ; copyright 2012, 3 pages.
Clark, et al., "Plug-n-Play, Reliable Power Systems for Nanosatellites", 20th Annual AIAAIUSU Conference on Small Satellites retrieved on May 21, 2008 from website http://ssdl.stanford.edu/ssdl/images/storieslAA236/A06Fall/ARFC/ssc06-vi-2.pdf, Retrieved on May 21, 2008 from website: http://ssdl.stanford.edu/ssdl/images/storieslAA236/A06Fall/ARFC/ssc06-vi-2.pdf, Aug. 2006, 1-6.
Orduz, R. et al., "Evaluation Test Results of a New Distributed MPPT Converter", 22nd European Photovoltaic Solar Energy Conference, Sep. 3-7, 2007, Milan, Italy.
Santos, J.L. et al., "Maximum Power Point Tracker for PV Systems", RIO 3—World Climate & Energy Event, Rio de Janiero, Brazil, Dec. 2003, 75-80.
Ton, D. et al., "Summary Report of the DOE High-Tech Inverter Workshop", Jan. 2005, 124 pages.
Walker, G.R et al., "PV String Per-Module Maximum Power Point Enabling Converters;", Proceedings of the Australasian Universities Power Engineering Conference, Christchurch, New Zealand, Oct. 2003, Total of 6 pages.
Xantrex Technology, Inc., , "PV Series Grid Tie Solar Inverters—Three Phase—North America", Accessed at: xantrex.comlweb/id/11/p/1/ptl23/product.asp, Feb. 3, 2010, Total of 1 page.

\* cited by examiner

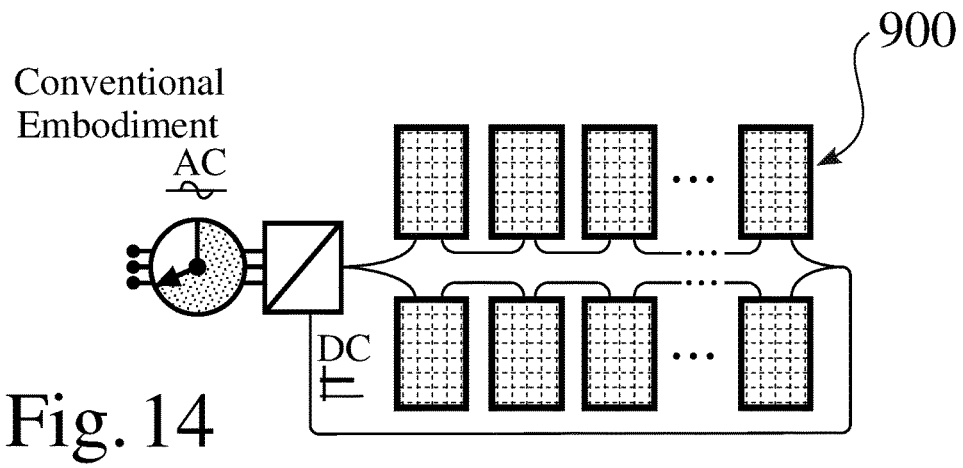
Fig. 14 — Conventional Embodiment
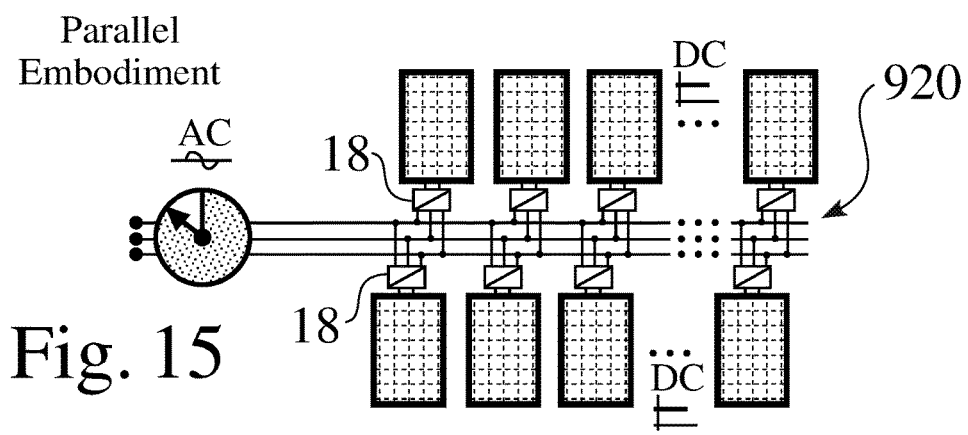
Fig. 15 — Parallel Embodiment
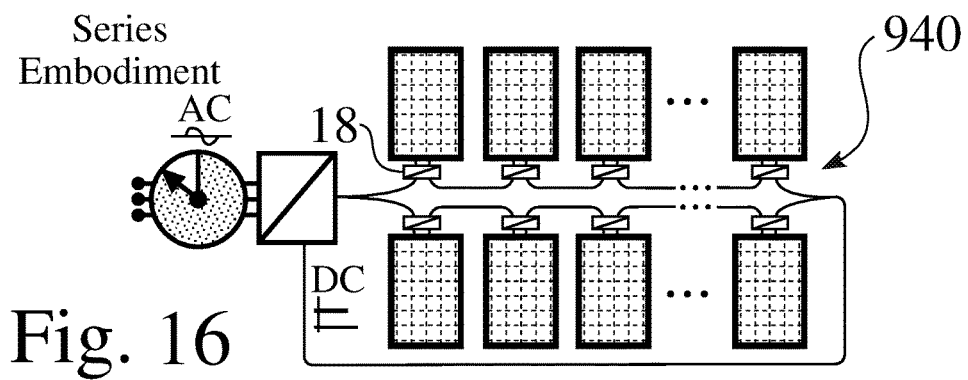
Fig. 16 — Series Embodiment

ENHANCED SOLAR PANELS, LIQUID DELIVERY SYSTEMS AND ASSOCIATED PROCESSES FOR SOLAR ENERGY SYSTEMS

CROSS-REFERENCE TO RELATED APPLICATIONS

This application is continuation of U.S. patent application Ser. No. 14/938,801, filed Nov. 11, 2015, which is a divisional of U.S. patent application Ser. No. No. 13/389,951, filed Feb. 10, 2012, which is a U.S. national entry to PCT Patent Application No. PCT/US2010/045352 filed 12 Aug. 2010, and claims priority to U.S. Provisional Application No. 61/234,181, filed 14 Aug. 2009, and U.S. patent application Ser. No. 12/842,864 filed 23 Jul. 2010, now U.S. Pat. No. 8,035,249.

FIELD OF THE INVENTION

The present invention relates generally to the field of power inverter systems. More particularly, the present invention relates to distributed power system structures, operation and control, and enhanced inverter systems, structures, and processes.

BACKGROUND OF THE INVENTION

Solar power is a clean renewable energy resource, and is becoming increasingly important for the future of this planet. Energy from the Sun is converted to electrical energy via the photoelectric effect using many photovoltaic cells in a photovoltaic (PV) panel. Power from a PV panel is direct current (DC), while modern utility grids require alternating current (AC) power. The DC power from the PV panel must be converted to AC power, of a suitable quality, and injected into the grid. A solar inverter accomplishes this task.

While solar panels often provide a cost effective and sustainable source of electricity, solar panels need frequent cleaning, up to four times a year, depending on their location and environment. Dirt and dust build-up on the panels prevents sunlight from reaching the silicon, reducing electrical output by up to twenty five percent.

For one prior installation, after a six-month period with no cleaning, a 25 percent increase in electrical output was achieved after washing for one group of solar panels, as compared to a similar neighboring group of panels without cleaning.

While thorough cleaning can increase the output of many solar panel installations, many prior methods and systems do not yield adequate results, or require costly and/or labor intensive operations. High-pressure wash systems often prove to be very ineffective and leave much of the panel dirty, as well as requiring lots of water. Low-pressure water systems, with soft bristle brushes, require thorough manual scrubbing. While a low-pressure system may be very effective, they are typically labor intensive.

SUMMARY OF THE INVENTION

Fluid delivery systems and related structures and processes are provided, such as for use with water, treated water, and/or a cleaning solution, for any of cleaning, cooling or any combination thereof, for one or more solar panels in a power generation environment. Enhanced coatings are provided for the incident surface of solar panels, such as to avoid build up of dirt, scale, or other contaminants, and/or to improve cleaning performance. Reclamation, filtration, and reuse structures are preferably provided for the delivered fluid, and seal structures may preferably be implemented between adjoining panels, to minimize loss of the delivered water or cleaning solution.

BRIEF DESCRIPTION OF THE DRAWINGS

FIG. 14 is a schematic view of exemplary conventional solar panels connected in series;

FIG. 15 is a schematic view of exemplary solar panels; and

FIG. 16 is a schematic view of exemplary solar panels.

DETAILED DESCRIPTION OF PREFERRED EMBODIMENTS

Enhanced Coated Power Panels. The efficiency of solar panels falls off rapidly as dirt and other impurities settles on the outer, e.g. upper, surface of the panels. The outer glass substrates 504 (FIG. 1) on the surface of solar panels 10, e.g. conventional solar panels 10 typically contain microscopic voids, fissures, and/or scratches 506, making them rough, wherein dust, dirt, scale, particulates, and other contaminants can readily adhere to the glass 504.

Figure 1:
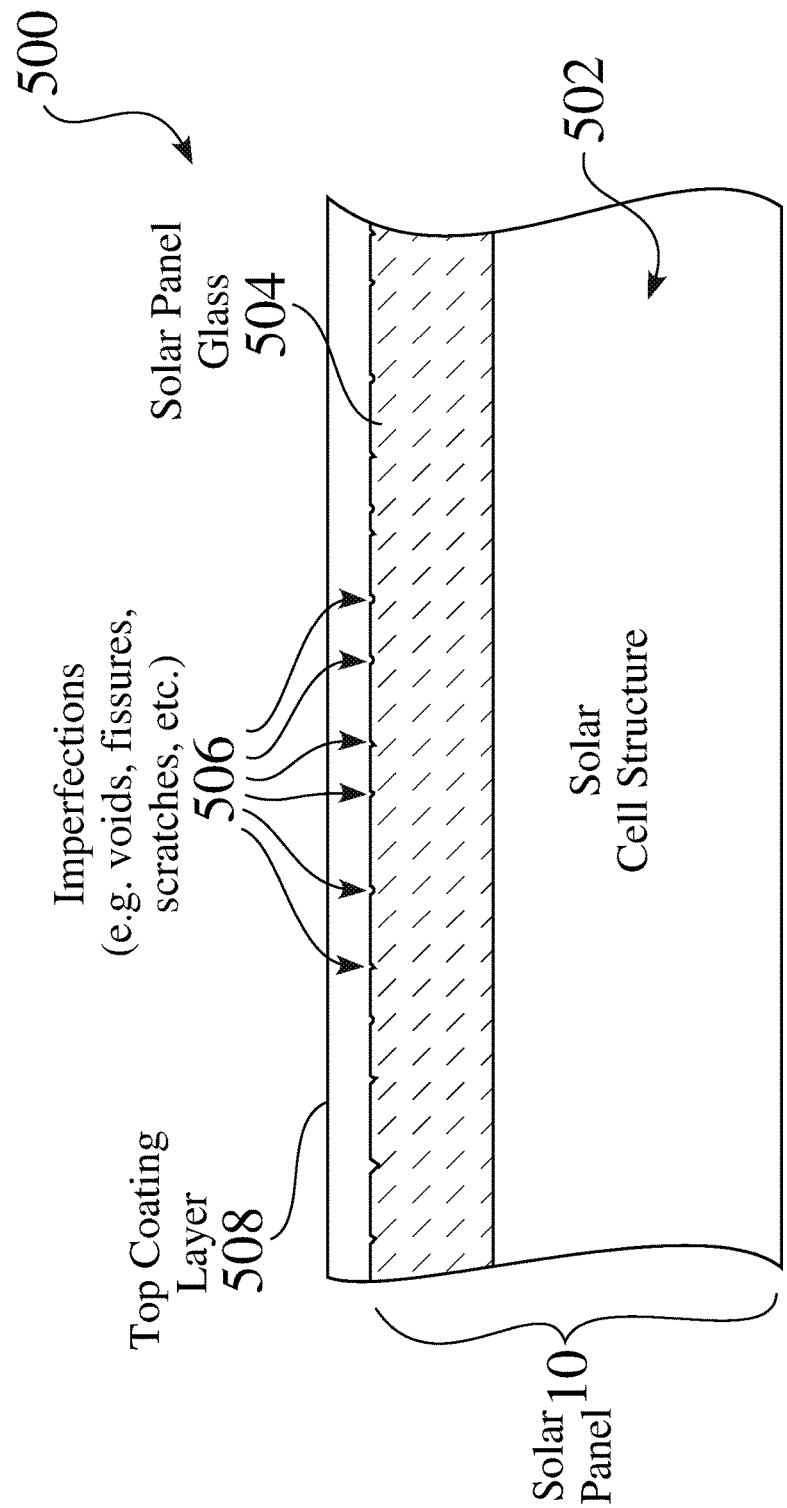
FIG. 1 is a partial cutaway view of an enhanced solar panel structure having a top coating layer.

FIG. 1 is a partial cutaway view of an enhanced solar panel structure 500 having a top coating layer 508. It is advantageous to provide such improvements to the outer optical structures 502,504 for solar panels 10, such as to provide enhanced cleaning, and/or to provide improved light adsorption. Coatings 508 can be applied to any of:

used, i.e. existing, solar panels 10 (such as with pre-cleaning)

new but conventional solar panels 10, e.g. in the field (such as with pre-treatment/cleaning); and/or new enhanced solar panels 10, with enhanced coatings 508 applied during production (before shipment).

In some embodiments, the coating materials 508 are described as nano-technology materials, as they provide enhanced cleaning and/or improved light adsorption on any of a macroscopic or microscopic level. For example, the coatings 508 may preferably fill in or reduce voids fissures, and/or scratches 506. As well, the coatings 508 may preferably prevent or reduce buildup of dust, dirt, scale, particulates, and/or other contaminants on the solar panel glass 504.

In some embodiments, the enhanced coatings may preferably comprise hydrophobic coatings 508, e.g. comprising silicon oxide, and/or hydrophilic coatings 508, e.g. comprising titanium oxide.

For example a thin layer, e.g. such as but not limited to about 5,000 Angstroms thick, of a hydrophobic coating 508, provides a surface to which dust and dirt has difficulty adhering. One such hydrophobic coating 508 currently used comprises a Teflon™ based coating 508, wherein incoming water, such as delivered 622,624, or by other means, e.g. rain, condensation, or fog, beads up on the glass 504, such as by reducing the surface contact between the liquid and the glass 504, and allowing the water to roll off, thereby accelerating the cleaning process.

The use of hydrophilic coatings 508, coupled with sunlight and moisture, may preferably react with deposits that land on the glass 504, such as to break down organic material to a point where it blows away in the wind, or washes off with water.

In some exemplary embodiments, the enhanced coatings may preferably comprise hydrophobic coatings 508, e.g. comprising silicon oxide, and/or hydrophilic coatings 508, e.g. comprising titanium oxide.

Other exemplary embodiments of the enhanced coatings 508 comprise both hydrophilic and hydrophobic components, such as to provide a coating material that provides any of reaction with and/or repelling incident water and/or contaminants.

Further exemplary embodiments of the enhanced coatings 508 may preferably comprise a component, e.g. an interference coating 508, that reduces the reflectivity of the glass 504, such as to allow more light to penetrate the glass and strike the solar cell structure 502, to produce more electricity.

Solar panels 10, e.g. such as conventional solar panels, may therefore be enhanced by any of a wide variety of coatings 508, such as to repel water, absorb light, and/or break down organic material. Such enhanced coatings 508 may preferably be used for any of reducing dirt buildup on solar panel glass layers 504, reducing cleaning time, and/or increasing the level of cleanliness achievable through cleaning procedures.

Figure 2:
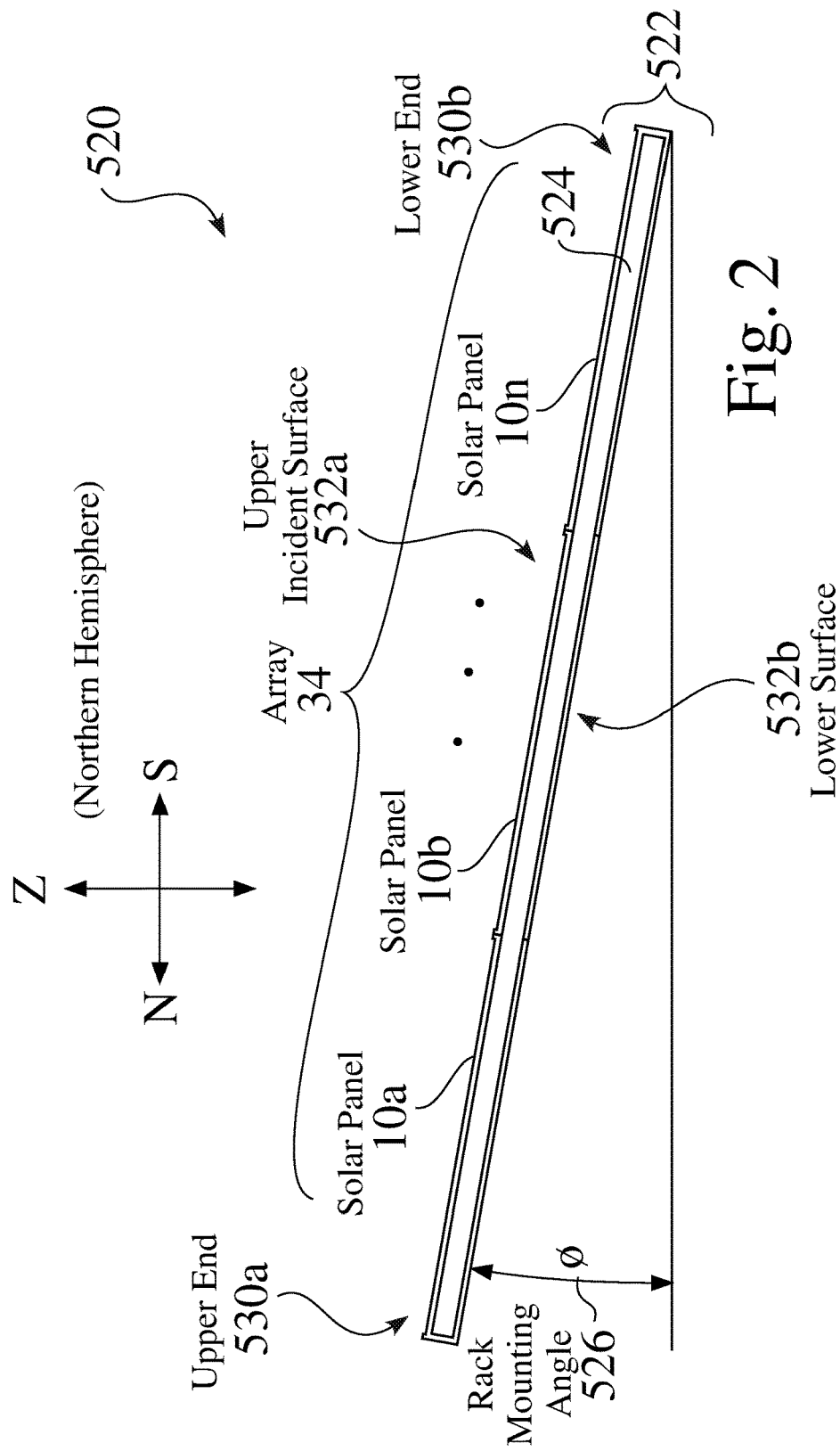
FIG. 2 is a simplified schematic view of an array of enhanced solar panels having a rack mounting angle.
Figure 3:
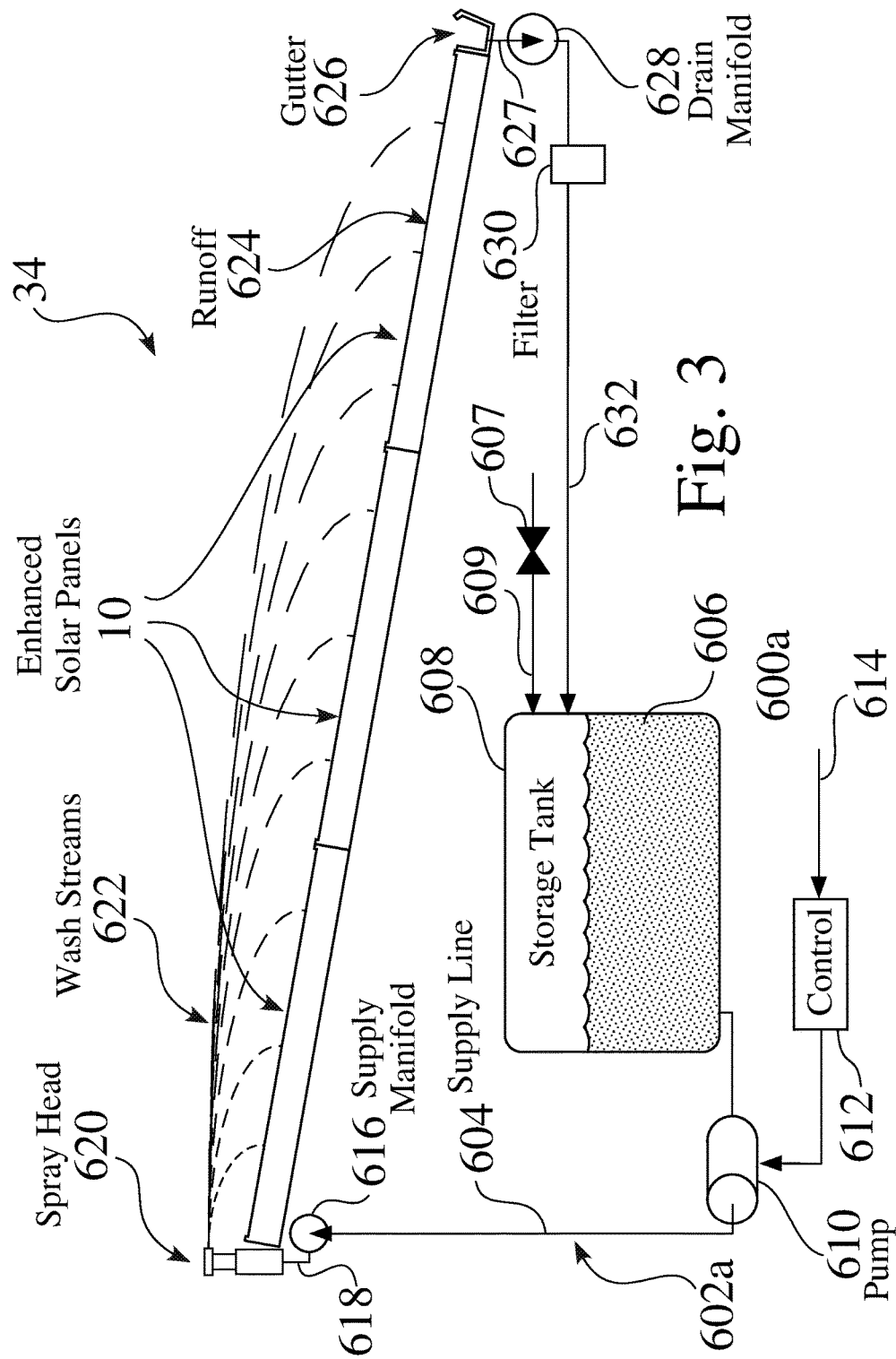
FIG. 3 is a simplified schematic view of a first exemplary embodiment of a fluid delivery system for array of enhanced solar panels.

Rack Mounting Angles for Solar Panel Arrays having Fluid Delivery Systems. FIG. 2 is a simplified schematic view 520 of an array 34 of solar panels 10, e.g. enhanced solar panels 10a-10n, such as assembled with one or more frame members 524, having a rack mounting angle ø526. FIG. 3 is a simplified schematic view of a first exemplary embodiment of a fluid delivery system 600a for an array 34 of solar panels 10, wherein the array 34 comprises one or more strings 36, e.g. 36a-36n of solar panels 10.

Fluid delivery systems 600, e.g. 600a, may preferably provide any of cleaning and/or cooling for one or more solar panels 10, such as by spraying 622 or otherwise distributing 624 water, which may further comprise a cleaner, over the incident surfaces 504 of an array 34 of one or more panels 10.

As seen in FIG. 2, the exemplary panels have a rack mounting angle 526. Conventional solar panel arrays have commonly been mounted with a rack angle 526 greater than zero degrees, such as to provide an increase in power harvest. For example, many solar panel arrays located in the Northern hemisphere have a rack mounting angle of about 8-10 degrees.

A conventional array of solar panels that are installed flat on a flat roof can theoretically provide 100 percent coverage across the roof, while a conventional array of solar panels that are installed with an eight degree slope on such a roof provides about 90 percent coverage, because of the aisle typically required between racking systems, such as to avoid shading between racks.

Panel arrays that have substantially higher rack angles, e.g. 20 degrees, have a higher front to back height ratio, which typically requires a larger distance between the racking structural rows, thereby resulting in less room for panels, such as for a horizontal roof installation. e.g. about 70 percent coverage for a flat roof system.

In an enhanced power generation system 40 that includes a fluid delivery system 600, such as for cleaning and/or cooling, the rack angle 526 may preferably be chosen for fluid movement 624, e.g. water run off, as well as for power harvest.

For example, one current embodiment of an enhanced power generation system 40 that includes a fluid delivery system 600, installed in Menlo Park, Calif., has a rack mounting angle 526 of about 8 degrees toward the South, which serves to increase power harvest and also allows testing of a fluid delivery system 600.

The specific rack angle 526 for a solar panel installation may preferably be chosen to facilitate self-cleaning during rainfall, automated, i.e. robotic, cleaning 764 (FIG. 10), and/or automated cooling 744 (FIG. 9), such as to reduce or avoid maintenance and/or cleaning problems associated with flat mounted panels 10.

For example, for the specific solar panels 10 used for the aforementioned installation, and as recommended for many fluid delivery systems 600, a rack angle 526 of at least 10 degrees (toward the South in the Northern hemisphere or toward the North in the Southern hemisphere) may preferably provide greater fluid movement 624, e.g. water run off 624, such as to decrease residual build up of impurities along the surface and lower edges of the solar panels 10.

As the rack mounting angle 526 is increased, such as between 15-20 degrees toward the Equator, fluid runoff 624 is increased, which can promote fluid reclamation and avoid deposition of contaminants at the lower edges of solar panels 10. The increased rack angle 526 also typically allows for a higher total year round harvest of electricity for installations that can accommodate such configurations, since in the winter, the Sun is lower on the horizon, so the additional tilt 526 of the panels 10 allows more light to be harvested. Because the higher slope results in better cleaning there is a trade off between effective cleaning and the concentration of panels on the roof.

The first exemplary embodiment of a fluid delivery system 600a seen in FIG. 3 comprises a mechanism 602a for delivering a fluid 606, e.g. water, such as for cleaning and/or cooling of one or more solar panels 10. The storage tank 608 seen in FIG. 3 may initially be filled through an inlet 609, such as through activation of a valve 607. The fluid 606 may typically comprise water, and may also comprise a cleaning agent. The water may further be treated to remove any of contaminants or hardness, and may further be chemically treated, such as with but not limited to chlorine, bromide, algaecide, etc.

The exemplary delivery mechanism 602a seen in FIG. 3 comprises a pump 610 that is controllable 612, such as in response to any of one or more tracked parameters, a set point, or an external signal 614. Fluid 606 is controllably pumped 610 through a supply line 604 to a supply manifold 616, which is then controllably distributed to one or more distribution heads 620, e.g. spray heads or sprinkler heads 620. The fluid 606 is typically applied as one or more wash streams or mists 622, such as to rinse the solar panels 10 for cleaning and/or cooling. The fluid 606 travels downward 624 across the solar panels 10, such as due to the rack angle 526.

The exemplary fluid delivery system 600a seen in FIG. 3 also comprises a mechanism for recovering the fluid 606, such as comprising a gutter 626 connected 627 to a drain manifold 628, which returns 632 toward the storage tank 608. The return line 632 may preferably further comprise a filter 630, e.g. a leaf filter, such as for but not limited to removal of leaves, dust, and/or dirt.

Figure 4:
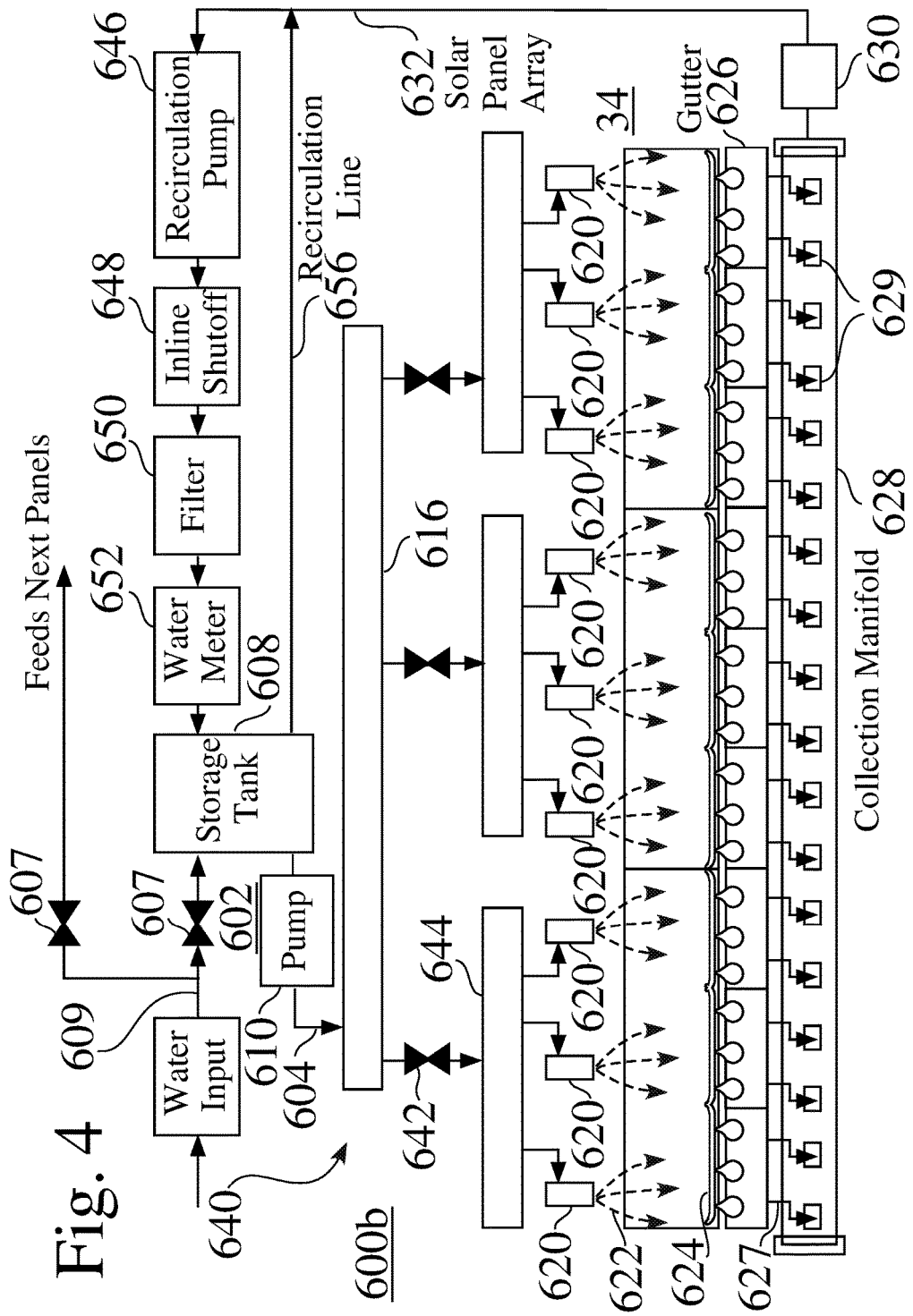
FIG. 4 is a detailed schematic diagram of a second exemplary embodiment of a fluid delivery system for array of enhanced solar panels.

FIG. 4 is a detailed schematic diagram 640 of a second exemplary embodiment of a fluid delivery system 600b for an array 34 of solar panels 10. As seen in FIG. 4, the water delivery mechanism 602 may further comprise one or more valves 642 and secondary manifolds 644, such as to controllably deliver fluid as needed, e.g. for cleaning and/or cooling, to one or more sections of solar panels 10, and/or to controllably isolate one or more sections of solar panels 10, such as for delivery system maintenance.

The collection gutter 626 may further comprise a protective screen to prevent leaves or objects other than the water run off 624 from entering the system 600. The collection manifold 628 for the fluid delivery system 600b seen in FIG. 4 may comprise a PVC pipe 628, e.g. 4 inch diameter, having a series of defined holes 629, wherein periodically spaced drain pipes 627 extend into. The exemplary drain pipes 627 are mounted with bulkhead connections to the outer lower edge of a rain gutter 626 that is attached along the lower edge of the series of solar panels 10.

While the fluid delivery system 600b is described herein as using spray heads 620 as one example of cleaning and/or cooling, a wide variety of stationary or mobile systems may be used, such as stationary sprays, rotating stationary heads, or even s a movable track to spray along the length, e.g. from top to bottom, moving sideways.

As also seen in FIG. 4, the return line 632 may also preferably comprise any of a recirculation pump 646, and inline shutoff 648, a filter 648, and/or a water meter 652.

In some embodiments 600, the filter 650 preferably removes or reduces levels of minerals, salts, and/or other contaminants from the fluid 606, e.g. water 606, such as depending on available water supplies. In one current embodiment of the fluid delivery system 600, the filter 650 comprises an ELYSATOR 15™ water conditioner, available through International Water Treatment of North America, such as to remove calcium and other minerals from the water 606, before the water 606 is returned to the storage tank 608.

One current embodiment of the storage tank 608 comprises a 300 gallon reservoir filled with tap water 606, which is pumped from the storage reservoir 608 to a four inch PVC water pipe 616 that runs along the length, e.g. 90 feet, of the racked array 34. Every thirty feet, a one inch pipe 644 is tapped off of the four inch pipe 616 through a solenoid operated valve 642. Each of the secondary manifolds 644 feeds three sprinkler heads 620 that wash the panels 10.

The water spray 622 from the spray heads 620 cascades 624 down the panels 10 and into the rain gutter 626, which empties into a collection manifold 628, e.g. a 4-10 inch irrigation pipe. The collected water 624 flows through the collection manifold 628 and through a primary filter, e.g. a leaf filter 630, which filters out large particles. The water is piped down 632 into the storage tank 608, and also is teed to a recirculation pump 646, e.g. a 30 watt pump 646, that feeds the secondary filter 650. The recirculation pump 646 may preferably continuously circulate the water 606 in and out of the storage tank 608, e.g. through a recirculation line 656, such as for continuous water filtration, i.e. polishing, by the secondary filter 650.

In one current embodiment of the solar power generation system having a fluid delivery system 600b as seen in FIG. 4, the distribution manifolds 644 are segmented into three 30 foot lengths, to accommodate three rows of panels 10, with a string of 11 panels in each row for a 33 panel test group. Each of the panels 10 has a monitoring box 18 attached that monitors voltage, current and temperature of the panel, and also allows the panel to be shut down in case of emergency or need of maintenance. This information is accessed from the panel through a wireless transmitting system, transmitted directly to a computer that displays all the vitals for each panel.

This 99 panel test system is divided up into three 33 panel sections, wherein each of the panels have been coated with nano-technology material 508, but were not initially washed, to start to gather dirt, which fell on these panels throughout the day and at night. When dew gathered, the dew wet the dirt, causing it to flow down the panels 10 and catching at the bottom of the panel against the aluminum edge were it sticks because there was not enough water volume in the dew to wash the dirt off the panel.

The installed system therefore provides some minimal washing of the dew itself, on its own, but the dirt gathered at the bottom because there was not sufficient water to completely flush it.

When such dirt settles across the bottom of a panel, such dirt may get thick enough to block out as much as 5 percent of the panel, which causes as much or more than a five percent decrease in power production from the entire string, because on a per panel basis, such an effected panel becomes a weak link.

For solar panel systems that are monitored on a per panel basis, i.e. not on a per cell basis, if the performance of one section of the panel 10, e.g. the lower edge, loses efficiency, e.g. such as by five percent, the efficiency of the entire panel 10 is reduced by five percent.

In the aforementioned system, all 99 panels were monitored, such as for performance testing. On the first 33 panel test section we are going to evaluate the effects of cooling the panels to generate additional electricity output. The cooling was provided by incrementally running water over the panels from early in the morning until late in the afternoon.

In some embodiments of the fluid delivery system 600, such as for installations having solar panels that are enhanced with a protective coating 508, compressed air may be used to blow loose dirt and dust from the panels 10, such as to minimize the use of water 606. As well, water may be used during the evening or at night, e.g. for periodic extra cleaning), such as to minimize evaporation during daylight hours.

Figure 5:
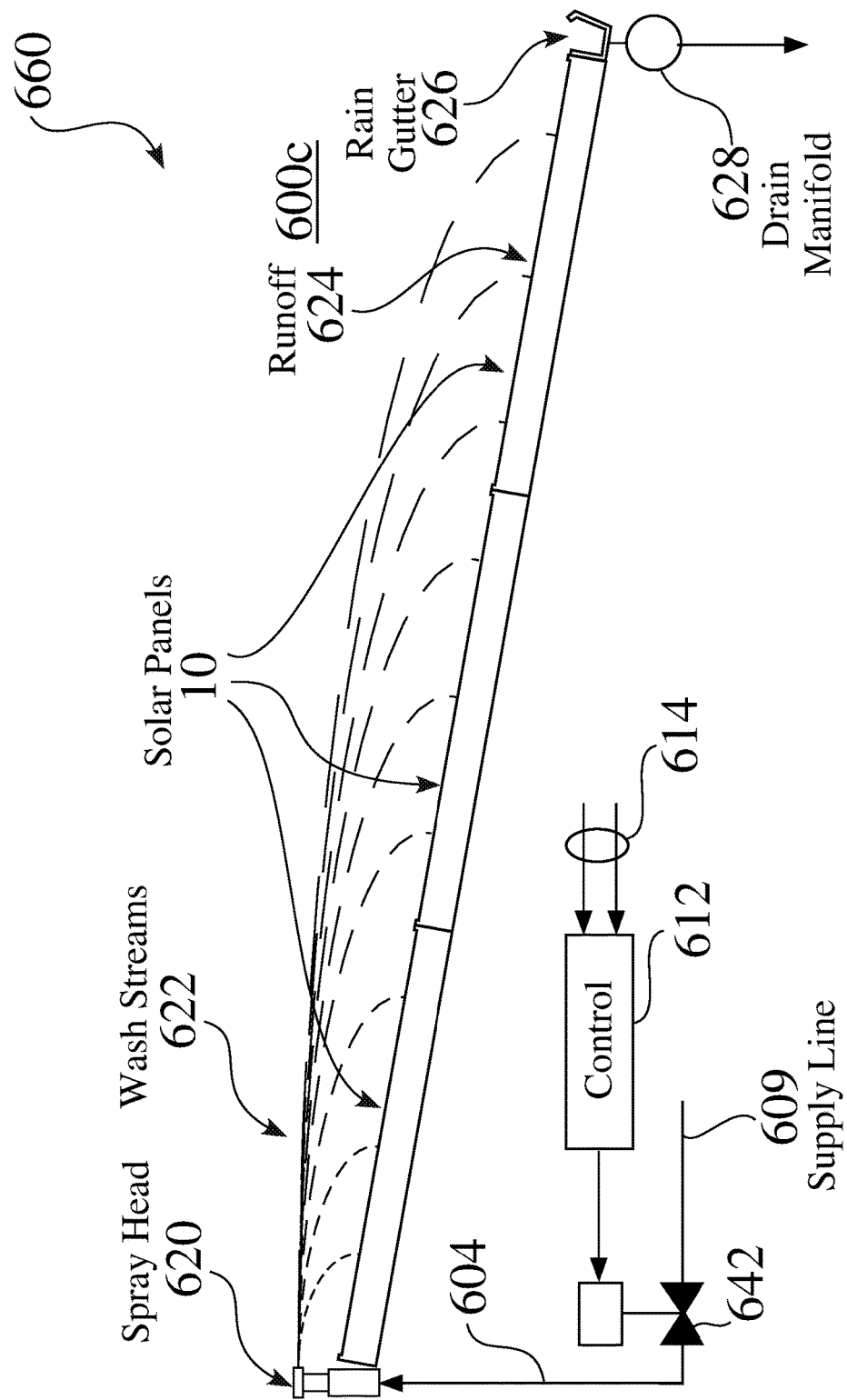
FIG. 5 is a simplified schematic view of a third exemplary embodiment of a fluid delivery system for array of enhanced solar panels.

FIG. 5 is a simplified schematic view 660 of a third exemplary embodiment of a fluid delivery system 600c for an array 34 of solar panels 10. In some system environments, such as where clean water is plentiful and cost effective, without either a need or desire for reclamation, a simplified fluid delivery system 600, e.g. 600c, may provide sufficient water for cleaning and/or cooling purposes. The fluid delivery system 600c seen in FIG. 5 comprises a fluid delivery mechanism 602, such as comprising a valve 642 that is responsive to control 612, typically in response to any of one or more tracked parameters, a set point, or an external signal 614. The fluid 606, e.g. water is sprayed 622 through spray heads 620, and runs off 624 the inclined solar panels 10 at the lower end, such as through a gutter 626 and a drain manifold 628.

The fluid delivery system 600, e.g. such as comprising a robotic watering system 600, is therefore typically installed along the top, i.e. upper end 530a (FIG. 2) of the racking system 34, and provides a slow cascade 624 of water 606 that runs down the face of the panels 10, such as at an optimized interval, or based upon a tracked parameter 614, to keep the power generation system 34 operating at maximum efficiency. Water 606 caught at the base of the racking 34 may preferably be recovered, e.g. such as through a manifold 628, filtered 650, and pumped back into the storage tank 608 for the next cleaning and/or cooling cycle.

In areas where the water contains calcium and other harsh chemicals that may be harmful to the panel, the water treatment 650 may also preferably comprise de-ionization. As well, an additional boost in electrical output may often be gained by cooling the panels 10 during the heat of the day, as the panels decrease output when exposed to higher temperatures.

Figure 6:
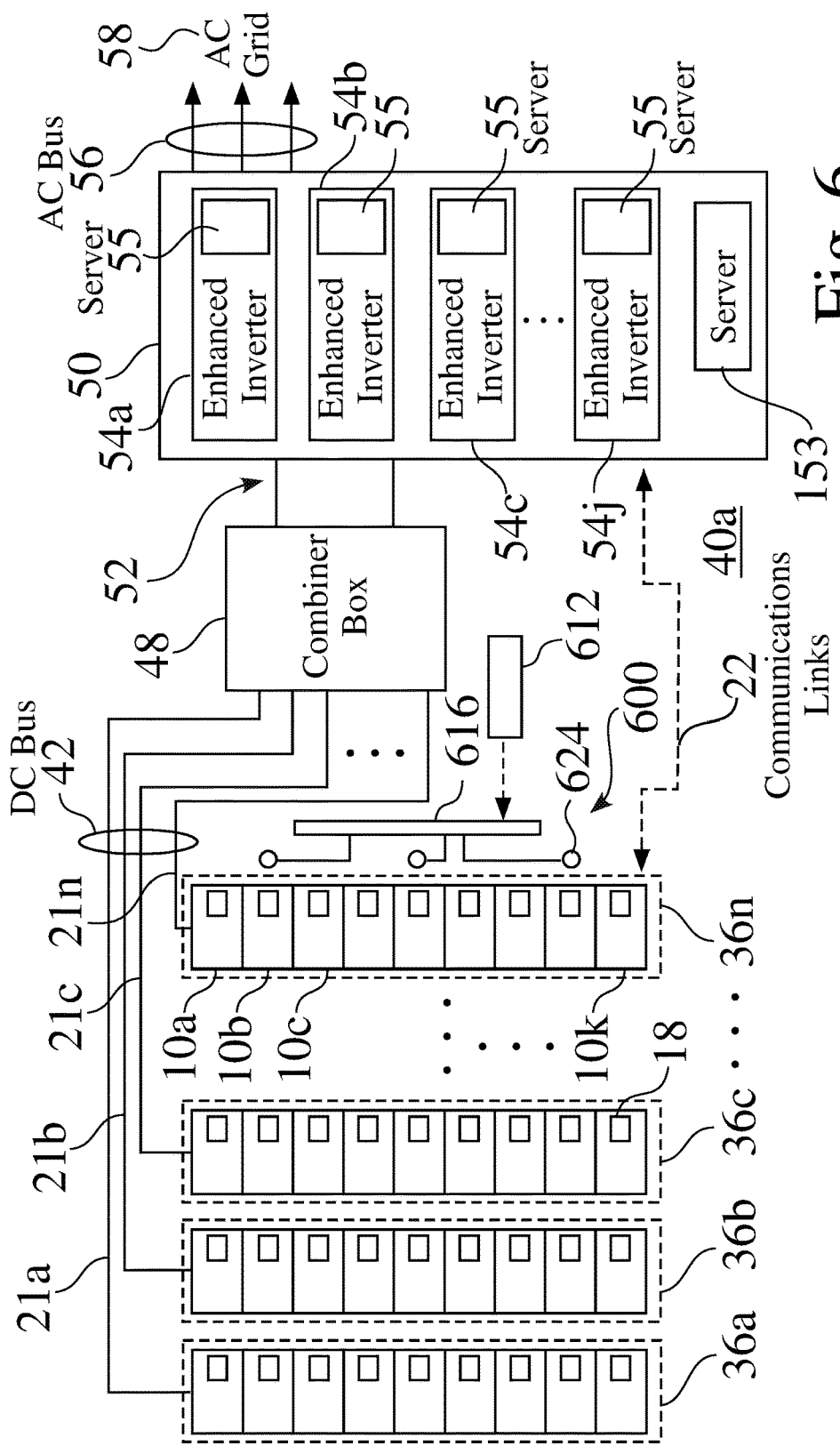
FIG. 6 is a schematic block diagram of an exemplary liquid distribution system integrated with an exemplary solar panel system having a plurality of strings of enhanced solar panels routed through a combiner box and controlled through a modular power module housing having one or more enhanced inverter modules.

FIG. 6 is a schematic block diagram of an exemplary fluid distribution system 600 integrated with an exemplary solar panel system having a plurality of strings 36, e.g. 36a-36n, of enhanced solar panels 10, that are routed through a combiner box 48 and controlled through a modular power module housing 50 having one or more enhanced inverter modules 54. Since the structure and process provides monitoring, control, and isolation of individual panels within a solar system, further enhancements can be made to provide enhanced system efficiency.

For example, for the enhanced power generation system shown in FIG. 6, each panel 10 preferably can monitor any of voltage, current, and/or temperature, and also preferably comprises a mechanism by which the panels 10 may be individually shut down, such as for emergencies. The individually monitored panels 10 preferably allow the output of each panel to be tracked. In some embodiments, when the efficiency drops by as much as 5 percent, the fluid delivery system may controllably be activated 764 (FIG. 10) to clean the panels 10. The enhanced power generation system shown in FIG. 6 is fully automated, such that workers are not required to access the roof for cleaning, thereby saving labor, water and insurance costs, while ensuring full production out of each solar panel 10 year round.

Figure 7:
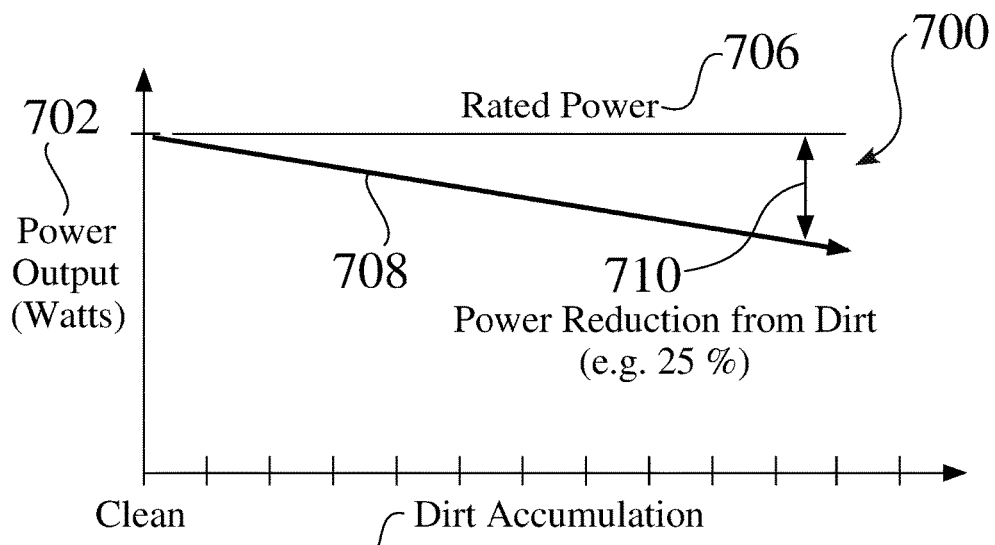
FIG. 7 is a chart that shows power reduction as a function of dirt accumulation for a solar panel structure.

Environmental Effects on Solar System Performance. FIG. 7 is a chart 700 that shows power reduction as a function of dirt accumulation 704 for a solar panel structure. Solar panels lose power therefore electrical output as a function of dirt accumulation. The standard wattage output for solar panels is tested at the factory with clean panels, such as to define a rated power 706, as tested at a controlled temperature, e.g. 25 degrees Celsius. In the field, however, as dirt accumulates on some or all of the surface of a panel 10, the actual power 708 decreases, i.e. is reduced 710, from its rated value, such as by as much or more than 5-6 percent of its rated value For example, especially for panels that are not enhanced with a coating 508 (FIG. 1), dirt and/or scale can build up along the bottom end 530b (FIG. 2) of solar panels 10, to the extent that the sunlight is reduced from reaching and being fully absorbed by the panels 10. This causes the entire panel to drop in voltage output by as much as from five to twenty five percent, depending on how severe the build-up is.

The use of a protective coating 508 on the incident surface 532a of the solar panels 10 allows the panels 10 to remain cleaner for a longer period of time, as the enhanced panels are resistant to a build up of dirt and/or scale, such that even before cleaning, the treated panels 10 have a higher electrical output than untreated panels. As well, the enhanced panels are more quickly and more thoroughly cleaned by the fluid delivery system, yielding higher power production for one or more of the solar panels 10.

Figure 8:
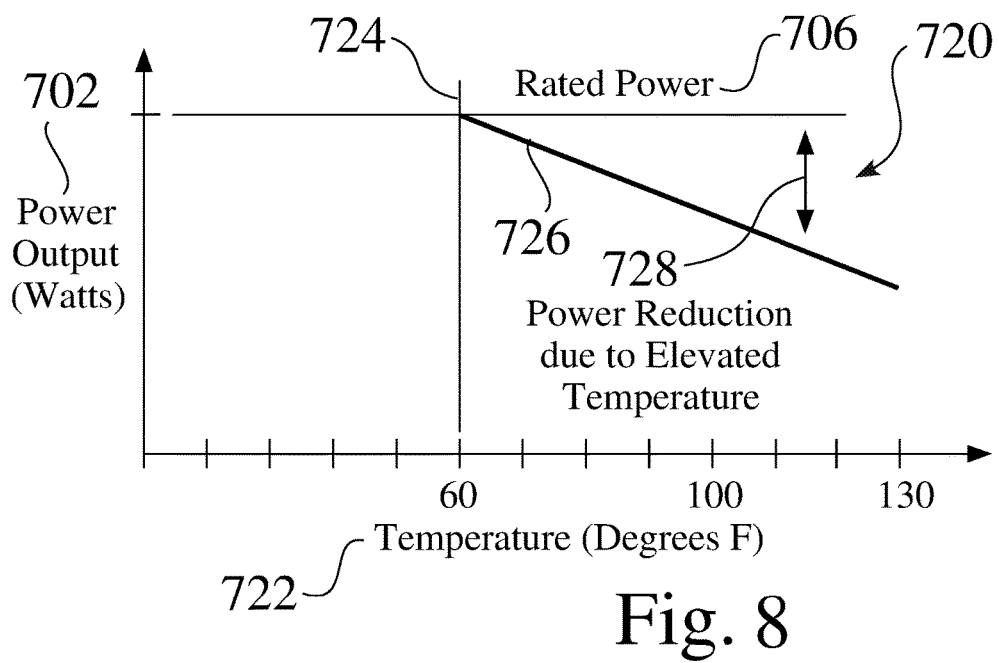
FIG. 8 is a chart that shows power output as a function of temperature for a solar panel structure.

FIG. 8 is a chart 720 that shows power output as a function of temperature 722 for a solar panel structure 10. Solar panels lose efficiency and therefore electrical output as a function of temperature. The standard wattage output for solar panels is tested at the factory at 25 degrees Celsius. For every Centigrade rise in temperature over a rated temperature, the panel's electrical output may typically decrease by ~0.5% of the rated output.

It is not uncommon, in warm weather, for the panel temperature to rise from about 25 degrees Celsius to about 83 degrees Celsius, as measured on the incident surface 532a of a solar panel 10. This 58 degree rise in temperature, based on an approximate 5 percent of rated output power, results in a total loss of approximately 58 watts on a 200 watt panel, e.g. a loss approaching 30 percent. This estimated loss is based on an absolutely clean panel 10. However, for common situations with a similar 83 degrees Celsius of heat on the panel, in addition to accumulated dirt, such an exemplary solar panel may lose an additional 25-30 watts, resulting in 110 watts of output power for a solar panel 10 that is nominally rated at 200 watts, because of the combined effects of heat and dirt. Therefore, depending on the environment, the fluid delivery system 600 may be used for any of cleaning and/or cooling of the panels 10.

Figure 9:
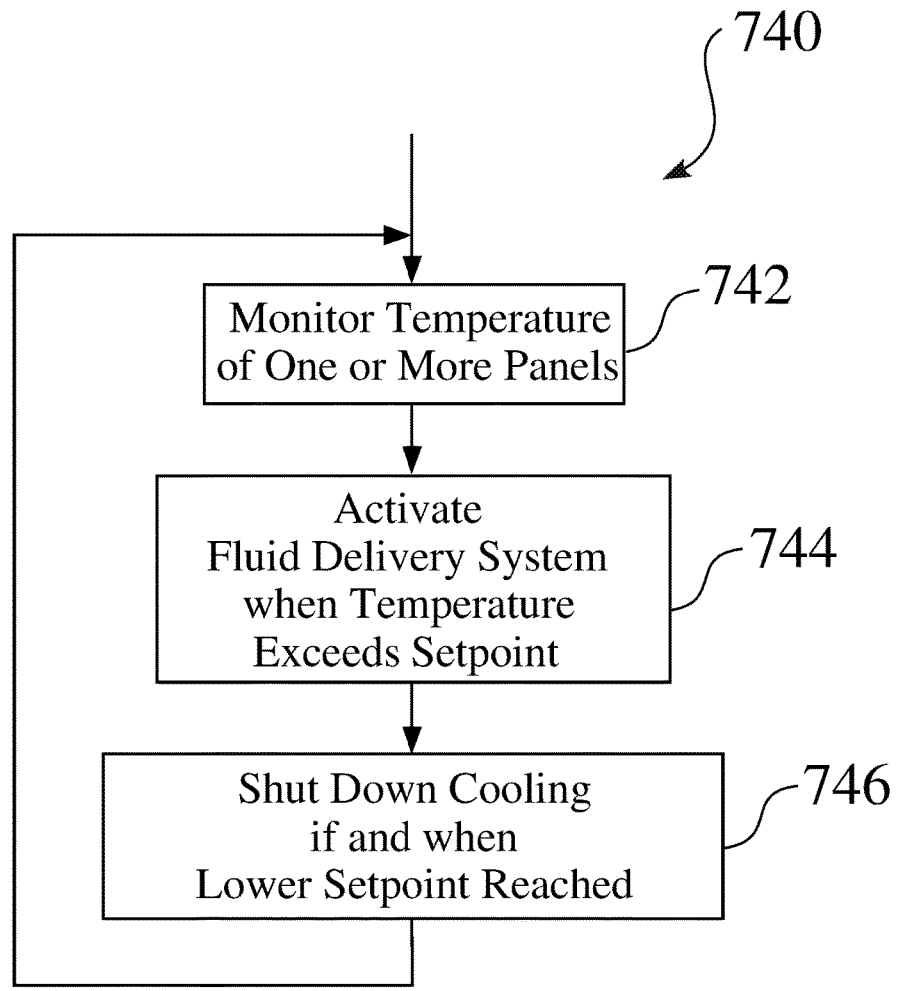
FIG. 9 shows a simplified process for activation of a solar system cooling system based upon temperature monitoring.

Enhanced Operating Processes for Fluid Delivery Systems Integrated with Solar Panel Systems. FIG. 9 shows a simplified process 740 for activation of a solar system cooling system based upon temperature monitoring. For example, while a solar panel system is operating, the temperature of one or more panels 10 may preferably be monitored 742. The fluid delivery system 600 may be controllably activated 744 when one or more of the tracked temperatures exceed a setpoint, e.g. 120 degrees F. The fluid delivery system 600 may operate for a set period of time upon activation 744, or may shut down 746 if and when a lower setpoint is reached, e.g. 70 degrees F., or within a certain threshold as compared to ambient temperature.

The temperature may preferably be monitored through the temperature sensor (e.g. thermometer, thermocouple, RTD, etc.) on each panel 10, and at the appropriate time and temperature, the system can controllably turn on the water for cooling. As an example, at a high setpoint, e.g. 90 degrees F., the control may trigger the system to turn on, and when the temperature drops to a low setpoint, e.g. 65 degrees F., the cleaning system 600 may preferably turn off.

Figure 10:
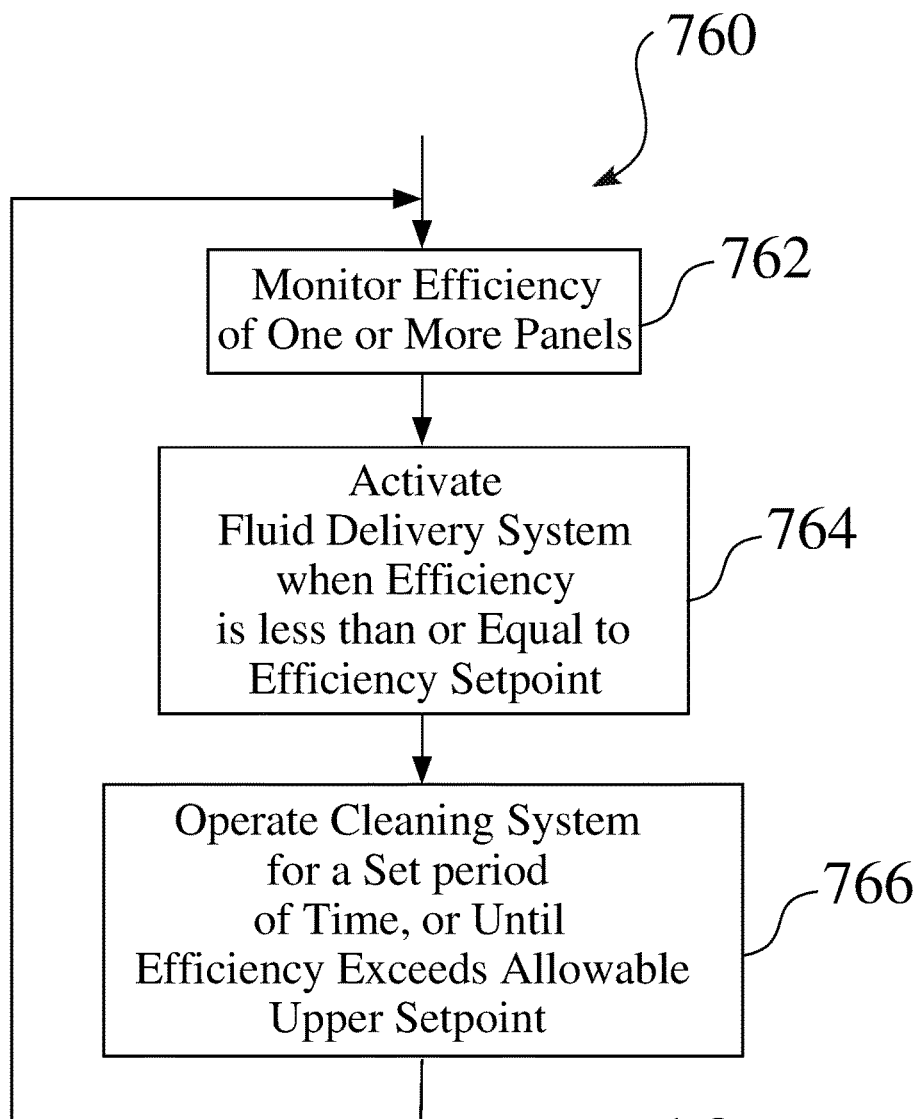
FIG. 10 shows a simplified process for activation of a solar cleaning system based upon efficiency monitoring.

FIG. 10 shows a simplified process 760 for activation of a solar cleaning system based upon efficiency monitoring. For example, while a solar panel system is operating, the efficiency of one or more panels 10 may preferably be monitored 762. The fluid delivery system 600 may be controllably activated 764 when one or more of the tracked efficiencies decreased below a setpoint, e.g. below 90 percent of rated power for a given temperature. The fluid delivery system 600 may operate for a set period of time upon activation 764, or may shut down 766 if and when a efficiency exceeds an allowable efficiency setpoint.

Figure 11:
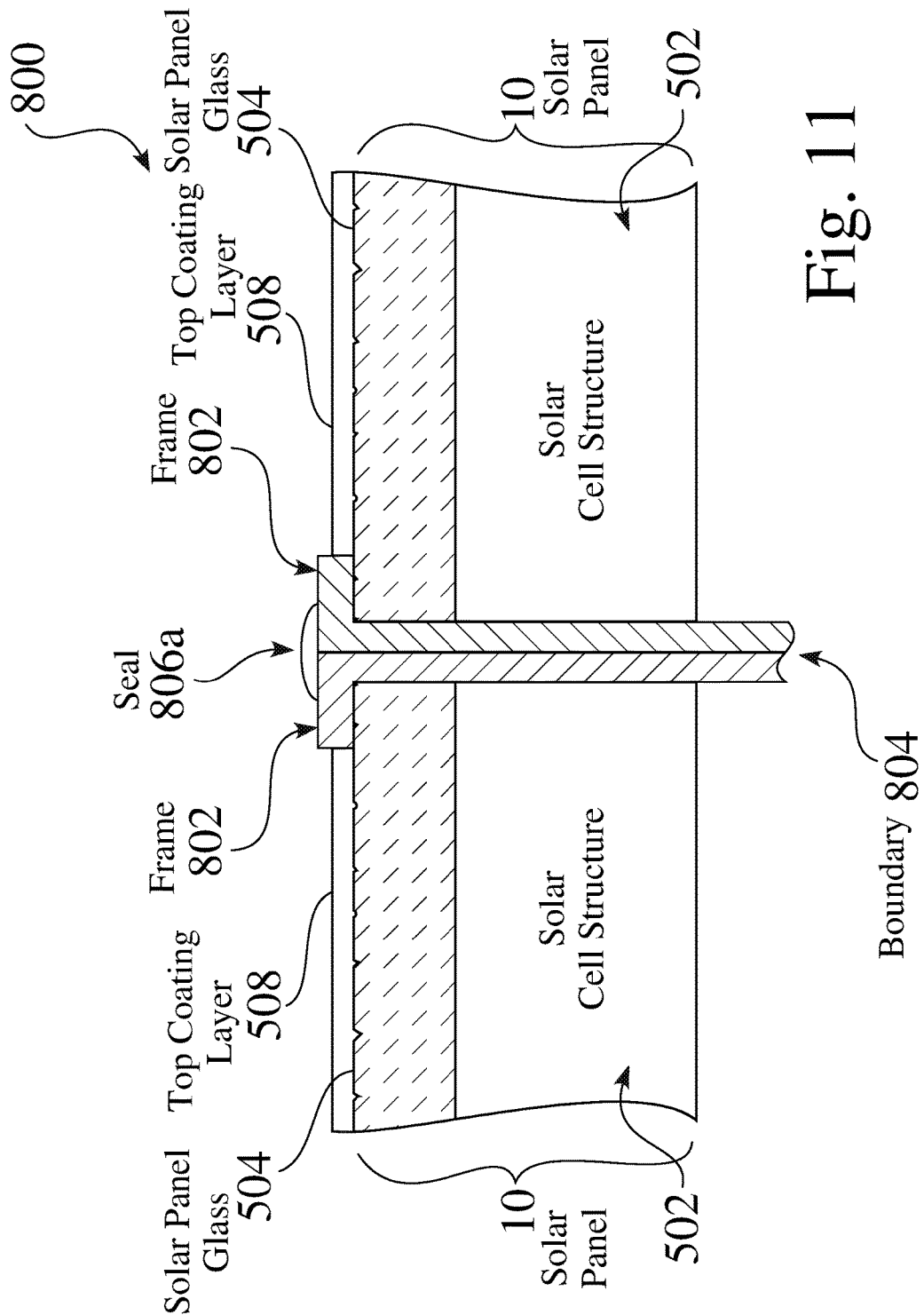
FIG. 11 is a partial cutaway view of a first exemplary seal structure between enhanced solar panels.
Figure 12:
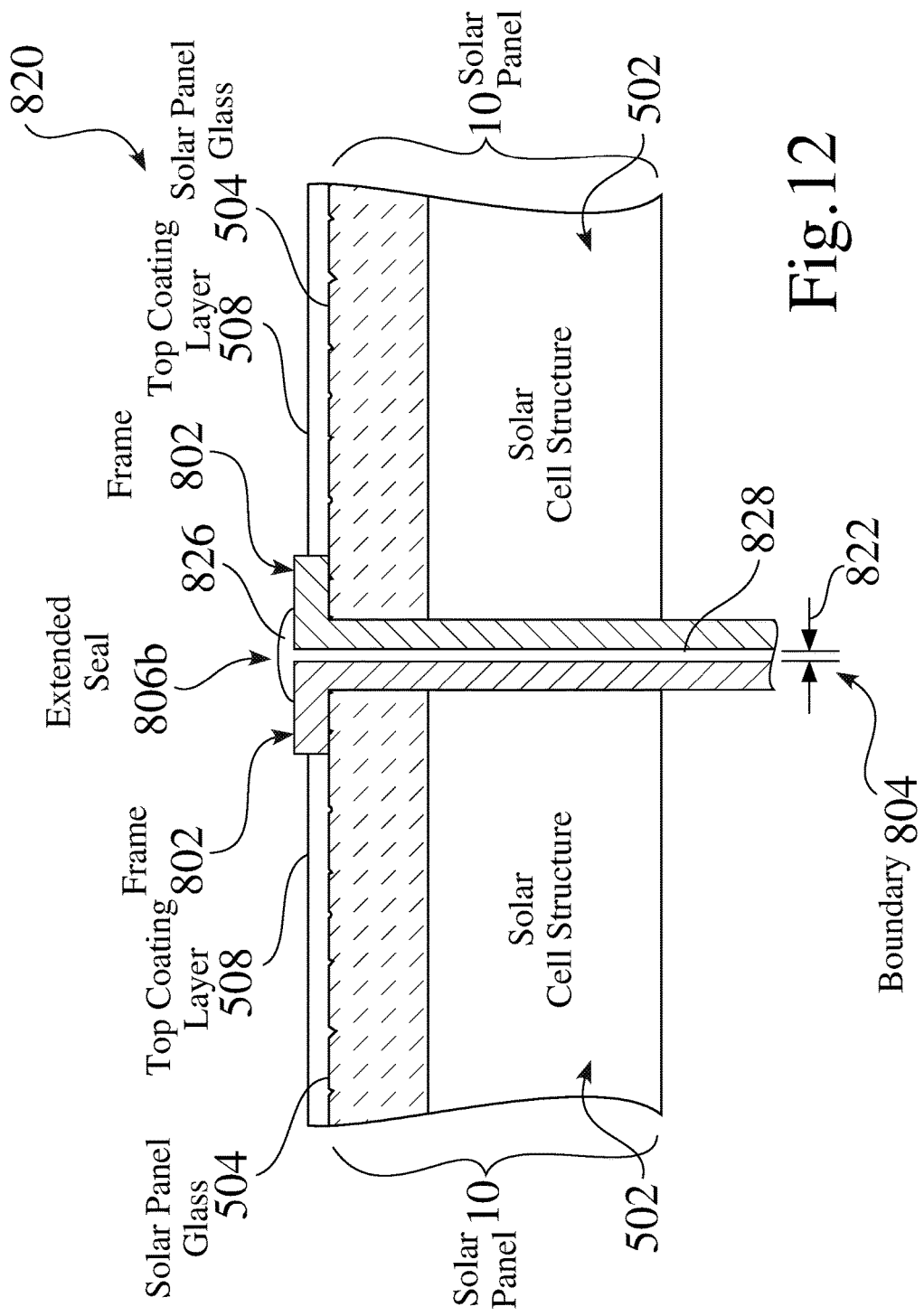
FIG. 12 is a partial cutaway view of a second exemplary seal structure between enhanced solar panels.
Figure 13:
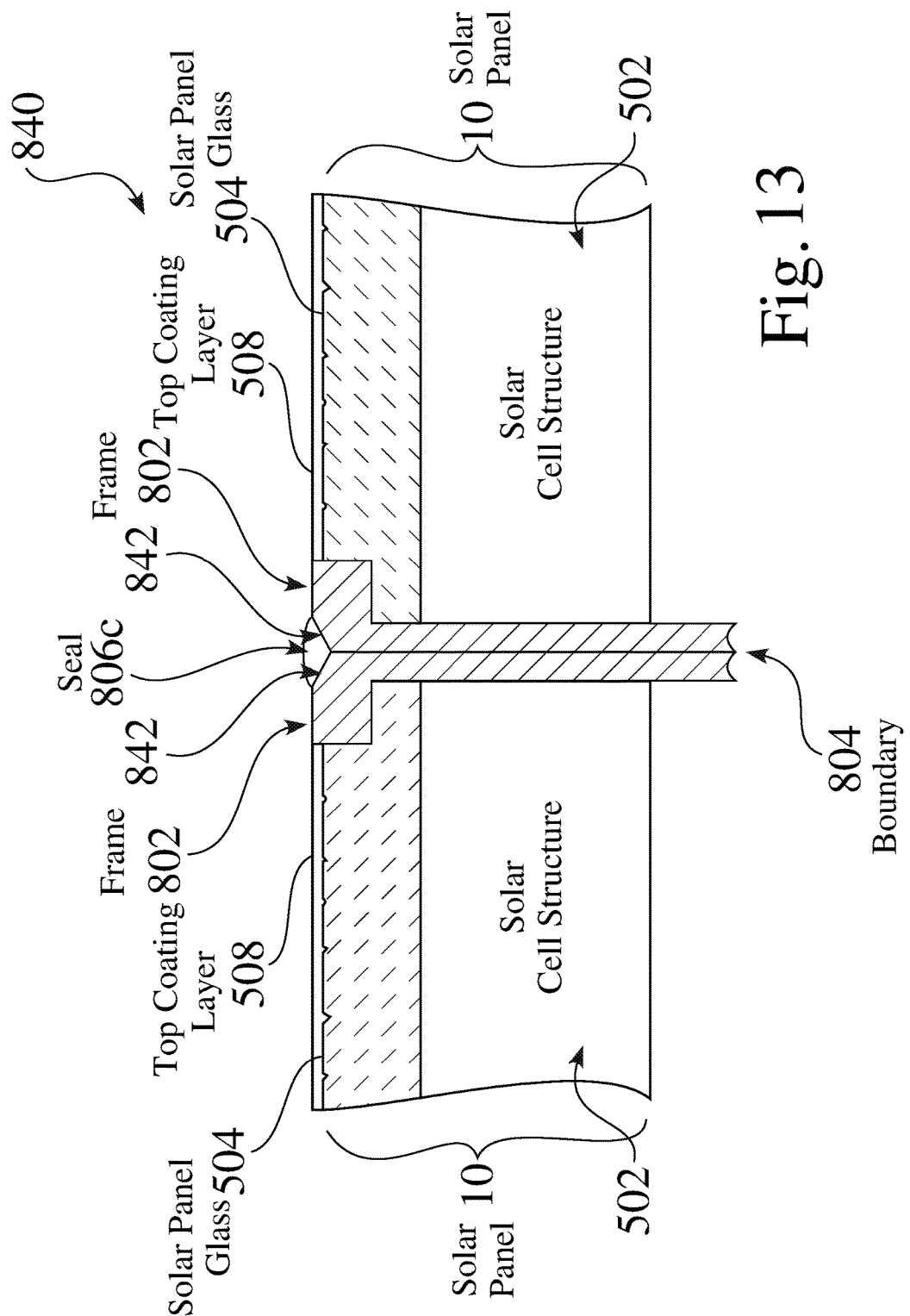
FIG. 13 is a partial cutaway view of a third exemplary seal structure between enhanced solar panels.

Solar Array Seal Structures. FIG. 11 is a partial cutaway view 800 of a first exemplary seal structure 806, e.g. 806a between enhanced solar panels 10. FIG. 12 is a partial cutaway view of a second exemplary seal structure 806b between enhanced solar panels 10. FIG. 13 is a partial cutaway view of a third exemplary seal structure 806c between enhanced solar panels 10.

As the fluid delivery system 600 is typically installed to provide water for cleaning and/or cooling, and as the water may preferably be recovered, stored and reused, arrays of solar panels 10 may preferably further comprise a sealer structure of sealant 806 at boundaries 804 between solar panels, e.g. such as between the bottom edge of one panels and the upper edge of an adjoining panel, and/or between the sides of adjoining panels 10.

The exemplary seal 806a seen in FIG. 11 may preferably comprise an applied silicone based sealant, such that water doesn't leak down and escape through the boundaries 804.

Similarly, the exemplary seal 806b seen in FIG. 12 may preferably comprise one or more structures, such as applied silicone based sealant, and/or suitable sealant strip material, e.g. having a thickness 822, to provide any of a top seal 826 and/or a lateral seal 828.

The exemplary seal 806c seen in FIG. 13 may preferably similarly comprise an applied silicone based sealant, such that water doesn't leak down and escape through the boundaries 804. As seen in FIG. 12, the enhanced solar panels 10 provide a frame 802 that is substantially flush to the combined height of the solar panel glass 504, which may also preferably have a coating layer 508, wherein the substantially flush interface may promote water runoff 624 and prevent any pooling along the bottom edge of a solar panel 10, e.g. such as to reduce build up of dirt and/or scale. The enhanced solar panels may therefore preferably include frames 802 that are flush to the glass substrate, at least for the upper and lower sides of the frame 802, such that dew, rain, and cooling and/or cleaning water can readily drain off toward the lower edge, wherein water is not accumulated upon the lower edge of each solar panel. In some embodiments, such frames are flush around the entire perimeter of the solar panel. The use of flush frames prevents any residual dirt and impurities from settling and drying along the lower edge of the panel, which could otherwise decrease the power output of the lower cells, and consequentially lower the entire output of the panel. As also seen in FIG. 12, the frames 802 may also include a recess, e.g. such as a bevel or radius 842, wherein a seal 806, e.g. 806c may be applied and still retain a substantially flush interface.

The material for the seals 806 may preferably be chosen for the expected temperature range and for other environmental conditions, e.g. exposure to Sunlight. Silicone sealant 608 is often rated for applications up to 300 degrees F.

In contrast to prior cleaning processes, as applied to conventional solar panels in the field, the enhanced cleaning system 600 provides several improvements, such as for one or more solar panels 10, in hardware configurations, and/or in system operation parameters. For example, such an individual panel monitoring system can immediately identify problem areas, such as related to dirt accumulation and/or elevated panel temperatures.

The fluid delivery system 600 and related structures and processes preferably provide several advantages for different environments, such as but not limited to:

cleaning solutions and/or protective layers for solar panel arrays;

application of cleaning solutions and/or protective layers, e.g. for any of retrofitting conventional panels on site, retrofitting new panels on site, and/or for new solar panels provided with enhanced layers;

delivery systems for use on a solar array; such as with water, treated water, and/or a cleaning solution, for any of cleaning, cooling or any combination thereof;

delivery/cleaning system spray distribution, reclamation, and/or filtering systems;

solar panel system layout or tilting for enhancement of delivery system. e.g. improved cleaning, flushing, cooling, and/or reclamation;

control parameters for a delivery system with time, power output, and/or temperature considerations; and/or improved solar panel frames and/or seals, e.g. such as to enhance cleaning, flushing, draining of any of a delivery system or for any resident moisture (dew, rain, etc.), such as to avoid buildup of dirt or scale., etc.

FIG. 14 is a schematic block diagram 900 of a solar panel system having a plurality of conventional solar panels connected in a series form, connected to a simple (unmodified) inverter, to convert the DC voltage from the string to an AC waveform.

FIG. 15 is a schematic block diagram 920 of an alternate exemplary solar panel system 40 having an arrangement of enhanced solar panels connected in a parallel manner. The common bus that the panels are connected to can be in the form of a stabilized DC bus, or a stabilized AC bus of a single or three phase variety, of a chosen voltage level. The common bus may terminate at grid interconnection, a transformer, an inverter of the enhanced or unmodified form, or a battery charger or other DC power grid. The panel enhancements perform the task of optimizing the output of the solar panel and adding power to the common bus.

FIG. 16 is a schematic block diagram 940 of an exemplary solar panel system 40, having a string of enhanced solar panels, and controlled through a modular power module housing having one or more enhanced inverter modules.

Additionally, the algorithms may preferably act to perform optimization to provide any of:

DC bus string voltage stabilization as a constant; or

Current stabilization as a constant, as may suit the conditions required for best total power output.

In an earlier installation of conventional solar panels, having a rated capacity of 400 KW, without individual monitoring, several outages resulted in significant loss in power output over extended periods of time. Monitoring of such a 400 KW system can save thousands of dollars in electricity bills as incidences of panel failure, which are conventionally only discovered by manually inspecting the panels.

In the aforementioned system, these outages were caused by, in one case, a panel being hit by a rock, in a second case by a bullet and in two cases, panels that failed, due to hot spots burning through the copper traces. As the system was initially installed without means for monitoring, there was no way of knowing how long these panels were out of commission, but they could have been down for six to eight months before detection. Not only did the system lose the performance of the afflicted panel, but also the weak-link effect brought down the performance of several of the connected strings, exacerbating the problem and loss of electricity.

Accordingly, although the invention has been described in detail with reference to a particular preferred embodiment, persons possessing ordinary skill in the art to which this invention pertains will appreciate that various modifications and enhancements may be made without departing from the spirit and scope of the disclosed exemplary embodiments.

The invention claimed is:

1. A power generation system, comprising:
  a server;
  a plurality of solar power panels, each comprising:
    a plurality of DC power cells, and
    a control module comprising input connections connected to the plurality of DC power cells, output connections, a signal processing circuit connected to the input connections and to the output connections, and a controller connected to the signal processing circuit, wherein the control module is configured to track one or more operating parameters for a corresponding solar power panel, and to send a data signal to the server, wherein the data signal corresponds to the one or more tracked operating parameters;
  at least one inverter having input DC terminals, output AC terminals, and an inverter circuit connected to the input DC terminals and output AC terminals; and
  a fluid delivery mechanism configured to distribute a liquid over an outer surface of at least a portion of the plurality of solar power panels;
  wherein the server is configured to monitor an efficiency and a temperature of one or more of the plurality of solar power panels based upon the received data signals, and to send a respective control signal to the fluid delivery mechanism when each of:
    the monitored efficiency is less than or equal to an efficiency setpoint, or
    the monitored temperature exceeds a temperature setpoint; and
  wherein the fluid delivery mechanism is controllably activated upon receipt of the control signal sent when the monitored efficiency is less than or equal to the efficiency setpoint or the monitored temperature exceeds the temperature setpoint.

2. The power generation system of claim 1, wherein the fluid delivery mechanism is activated for any of cleaning or cooling of the plurality of solar power panels.

3. The power generation system of claim 1, wherein the liquid comprises water.

4. The power generation system of claim 3, wherein the liquid further comprises a cleaning solution.

5. The power generation system of claim 1, wherein the plurality of solar power panels has an upper incident surface for receiving incoming light, and wherein any of a hydrophilic layer or a hydrophobic layer is applied to the upper incident surface of one or more of the plurality of solar power panels.

6. The power generation system of claim 5, wherein the hydrophilic layer comprises titanium oxide.

7. The power generation system of claim 5, wherein the hydrophobic layer comprises any of silicon oxide or a fluoropolymer.

8. The power generation system of claim 1, wherein the plurality of solar power panels has an upper incident surface for receiving incoming light, and wherein an interference layer is applied to the upper incident surface of one or more of the plurality of solar power panels to promote light penetration through the upper incident surface.

9. The power generation system of claim 1, wherein the tracked operating parameters comprise any of temperature, voltage, or power.

10. The power generation system of claim 1, further comprising:
  a recovery system for collecting and storing at least a portion of the distributed liquid.

11. The power generation system of claim 10, wherein the recovery system further comprises a filter for filtering the collected distributed liquid.

12. The power generation system of claim 1, further comprising:
  a seal located between at least two of the plurality of solar power panels.

13. A power generation system, comprising:
  a server;
  a plurality of solar power panels, each comprising:
    a plurality of DC power cells, and
    a control module comprising input connections connected to the plurality of DC power cells, output connections, a signal processing circuit connected to the input connections and to the output connections, and a controller connected to the signal processing circuit, wherein the control module is configured to track one or more operating parameters for a corresponding solar power panel, and to send a data signal to the server, wherein the data signal corresponds to the one or more tracked operating parameters;
  at least one inverter having input DC terminals, output AC terminals, and an inverter circuit connected to the input DC terminals and output AC terminals; and
  a fluid delivery mechanism configured to distribute a liquid over an outer surface of at least a portion of the plurality of solar power panels;
  wherein the server is configured to monitor a temperature of one or more of the plurality of solar power panels based upon the received data signals, and to send a control signal to the fluid delivery mechanism when the monitored temperature exceeds a temperature setpoint; and
  wherein the fluid delivery mechanism is controllably activated upon receipt of the control signal sent when the monitored temperature exceeds the temperature setpoint.

14. The power generation system of claim 13, wherein the fluid delivery mechanism is activated for cooling of the plurality of solar power panels.

15. The power generation system of claim 13, wherein the liquid comprises water.

16. The power generation system of claim 13, wherein the plurality of solar power panels has an upper incident surface for receiving incoming light, and wherein any of a hydrophilic layer or a hydrophobic layer is applied to the upper incident surface of one or more of the plurality of solar power panels.

17. The power generation system of claim 16, wherein the hydrophilic layer comprises titanium oxide.

18. The power generation system of claim 16, wherein the hydrophobic layer comprises any of silicon oxide or a fluoropolymer.

19. The power generation system of claim 13, wherein the plurality of solar power panels has an upper incident surface for receiving incoming light, and wherein an interference layer is applied to the upper incident surface of one or more of the plurality of solar power panels to promote light penetration through the upper incident surface.

20. A power generation system, comprising:
a server;
a plurality of solar power panels, each comprising:
   a plurality of DC power cells, and
   a control module comprising input connections connected to the plurality of DC power cells, output connections, a signal processing circuit connected to the input connections and to the output connections, and a controller connected to the signal processing circuit, wherein the control module is configured to track one or more operating parameters for a corresponding solar power panel, and to send a data signal to the server, wherein the data signal corresponds to the one or more tracked operating parameters;
at least one inverter having input DC terminals, output AC terminals, and an inverter circuit connected to the input DC terminals and output AC terminals; and
a fluid delivery mechanism configured to distribute a liquid over an outer surface of at least a portion of the plurality of solar power panels;
wherein the server is configured to monitor an efficiency and a temperature of one or more of the plurality of solar power panels based upon the received data signals, and to send a control signal to the fluid delivery mechanism when:
   the monitored efficiency is less than or equal to an efficiency setpoint, or
   the monitored temperature exceeds a temperature setpoint; and
wherein the fluid delivery mechanism is controllably activated upon receipt of the control signal to clean the plurality of solar power panels when the monitored efficiency is less than or equal to the efficiency setpoint and to cool the plurality of solar power panels when the monitored temperature exceeds the temperature setpoint.

\* \* \* \* \*